United States Patent [19]

JenningsCheck

[11] Patent Number: 5,059,924
[45] Date of Patent: Oct. 22, 1991

[54] CLOCK ADAPTER USING A PHASE LOCKED LOOP CONFIGURED AS A FREQUENCY MULTIPLIER WITH A NON-INTEGER FEEDBACK DIVIDER

[75] Inventor: William S. JenningsCheck, Orangevale, Calif.

[73] Assignee: Level One Communications, Inc., Folsom, Calif.

[21] Appl. No.: 514,596

[22] Filed: Apr. 26, 1990

Related U.S. Application Data

[63] Continuation-in-part of Ser. No. 425,709, Oct. 23, 1989, abandoned, which is a continuation-in-part of Ser. No. 268,240, Nov. 7, 1988, abandoned.

[51] Int. Cl.⁵ .................... H03L 7/099; H03L 7/18
[52] U.S. Cl. ..................... 331/1 A; 331/25; 331/34; 331/57; 331/179
[58] Field of Search ............... 331/1 A, 14, 16, 34, 331/45, 57, 179, 25

[56] References Cited

U.S. PATENT DOCUMENTS

| | | | |
|---|---|---|---|
| 3,731,219 | 5/1973 | Mader et al. | 331/14 |
| 4,091,335 | 5/1978 | Giolma et al. | 331/1 A |
| 4,584,695 | 4/1986 | Wong et al. | 328/63 X |

Primary Examiner—Siegfried H. Grimm
Attorney, Agent, or Firm—Merchant, Gould, Smith, Edell, Welter & Schmidt

[57] ABSTRACT

A phase locked loop configured as a frequency multiplier capable of nonintegral feedback path division utilizes a multiphase voltage controlled oscillator (5) which generates a plurality of signals (10a–10f) having a substantially identical frequency but each offset equally from the other by a given phase angle. A commutator (3) selects signals of adjacent phases so as to give the time average output signal (9) a frequency higher or lower than the frequency 10a–10f. Frequency translation is accomplished by periodically selecting signals having a longer or shorter period as desired so that a commutator output signal (9) is delayed or advanced by an appropriate amount. In the preferred embodiment, the phase locked loop is capable of converting a 1.544 MHz signal to a 2.048 MHz signal or vice versa.

16 Claims, 6 Drawing Sheets

CLOCK ADAPTER USING A PHASE LOCKED LOOP CONFIGURED AS A FREQUENCY MULTIPLIER WITH A NON-INTEGER FEEDBACK DIVIDER

This application is a continuation-in-part of U.S. application Ser. No. 425,709, filed Oct. 23, 1989, and now abandoned which is a continuation-in-part of U.S. application Ser. No. 268,240, filed Nov. 7, 1988, and now abandoned.

FIELD OF THE INVENTION

This invention relates to a phase locked loop configured as a frequency multiplier, which utilizes a controlled commutator to achieve frequency translation in the feedback path, to achieve a non-integer divide ratio, and thereby produce an output that is not an integer multiple of the reference input. A preferred embodiment discloses a circuit that directly translates a 2.048 MHz clock to a 1.544 MHz clock and vice versa.

DESCRIPTION OF THE RELATED TECHNOLOGY

The use of a phase locked loop as a frequency multiplier is well documented in the literature. The conventional implementation of such a circuit introduces a digital divider into the feedback path of the loop. In this way the output of the VCO is divided by an integer N before it is compared to the reference input by the phase comparator. In order for the loop to lock, both the reference input and the divided VCO output must be identical in both phase and frequency. To achieve this, the loop must maintain the output of the VCO at a frequency that is N times greater than that of the reference input. Since a digital divider is limited to division by an integer, a frequency multiplier which includes a digital divider can only produce an output which is an integer multiple of the input reference.

In the field of telephone switching systems, the primary digital carrier employed in North America consists of twenty-four channels operating at a 1.544 megabits per second rate. In the multiplex digital switching systems used in Europe and in many Private Branch Exchanges (PBX), 32 channels are switched at a 2.048 megabits per second rate. Equipment that interfaces to both types of systems has the constant need to convert a 2.048 MHz clock to a 1.544 MHz clock and vice versa. A clock adapter, used for this purpose, must either accept a 2.048 MHz input clock as its reference and produce a 1.544 MHz output clock, or accept a 1.544 MHz input clock as its reference and produce a 2.048 MHz output clock. In both cases the clock adapter must produce an output that is not an integer multiple of the reference input. Clearly, a conventional frequency multiplier will not work in this application and an alternate solution must be found.

Several devices have been developed to address the problem of clock conversion, such as disclosed in U.S. Pat. No. 4,154,985, issued to Ernst A. Munter. The Munter patent discloses a frequency converter circuit composed of a series connection of a frequency multiplier, a digital frequency converter and a second frequency multiplier. In the Munter device the first frequency multiplier produces an intermediate frequency higher than the desired output. The digital frequency converter in turn modifies the period of the intermediate frequency clock, in intervals established by the period of the intermediate clock, to produce an intermediate clock that has the desired frequency. The intermediate clock, however, contains a large amount of jitter making it unsuitable for use in the system. A second phase locked loop, also configured as a frequency multiplier with a narrow bandwidth loop filter, is used to reduce the jitter and also produces a "two times" clock output used elsewhere in the system. Such a solution is costly and relatively complex since two frequency multipliers are required.

U.S. Pat. No. 4,360,788, issued to Erps et al., discloses an implementation which uses only one frequency multiplier. This embodiment uses a phase locked loop frequency synthesizer that incorporates a single side band mixer, a pulse incrementer and a programmable frequency divider in the feedback path. The single side band mixer and the pulse incrementer allow the output of the VCO to be slightly shifted before reaching the programmable divider. In this way non-integer multiples of the reference frequency can be generated. Such a circuit could be used to convert a 2.048 MHz clock to a 1.544 MHz clock and vice versa. For example, if the disclosed circuit were used to convert a 2.048 MHz clock to a 1.544 MHz clock, the combined effect of the single side band mixer and the pulse incrementer would be required to translate the VCO output 504 kHz lower in frequency. This would allow the loop to maintain the VCO output at the desired frequency. In this configuration, however, the accuracy of the output is dependent not only on the input reference but also on the accuracy of the signal source used to drive the single side band mixer. The Erps, et al. solution, therefore, involves a relatively high degree of complexity and multiple sources of potential error.

U.S. Pat. No. 3,516,007, issued to Bos et al., discloses a circuit that increases the resolution of the programmable divider in the feedback path and thereby allows the frequency multiplier to produce noninteger multiples of the reference input. By adding and deleting pulses applied to the programmable divider the time average frequency of the feedback signal is shifted. In order to remain locked the VCO output is driven slightly higher or lower in frequency. Further, by controlling the feedback signal in this manner the typically stringent requirements on the loop filter are somewhat reduced. While this solution is practical for increasing the resolution by a factor of ten, it becomes difficult to implement as the degree of resolution increases. In order to convert 2.048 MHz. to 1.544 MHz the divide ratio required would be 1.544/2.048 or 0.75390625. The degree of resolution that would be required to achieve this division ratio renders the Bos et al. solution impractical. Even if a practical solution could be found, the integration time required to achieve a time average frequency of the feedback signal equal to that of the input signal would once again place severe constraints on the design of the loop filter.

The concept of modifying the period of the feedback signal is also presented in U.S. Pat. No. 3,516,007. The circuit disclosed in the '007 patent, however, can only adjust the period of the feedback signal in intervals defined by the period of the VCO output clock. The invention disclosed in the present application is capable of adjusting the period of the feedback signal in substantially smaller intervals.

In all of the previous designs just discussed, one common theme can be found. All circuits use a single phase VCO. Various derivations on how the feedback signal is generated have been presented but all use one VCO output.

The present device also includes a controlled commutator, examples of which can be found in other references. U.S. Pat. No. 4,584,695 issued to Wong et al., clearly describes a multi phase oscillator and a controlled commutator used to make small adjustments in the clock used by their system to recover data. In the Wong et al. disclosure the oscillator and controlled commutator is operated open loop.

Also relevant is U.S. Pat. No. 4,733,197 issued to Chow et al. The block diagram of this circuit is somewhat similar to the present invention. The key differences include the fact that the Chow et al. VCO has only one output, the multiple phases used by downstream logic are generated in a purely digital block, and the commutator is used to make relatively large phase adjustments in the feedback signal in order to extend the lock range of the loop.

SUMMARY OF THE INVENTION

The present invention is a phase locked loop frequency multiplier. The particular embodiment disclosed converts a 2.048 megahertz clock to a 1.544 megahertz clock or vice versa. Whereas previous frequency multipliers have been made to multiply by non-integer values by periodically adjusting the period of the feedback signal from the VCO, the present invention uses a multiphase VCO and a controlled commutator to adjust the period of the feedback signal before it is applied to the feedback divider in steps that are smaller than currently possible by state of the art means. The various VCO phases are equally spaced in time. By periodically switching from one original phase to a phase that either leads or lags the original phase, the period of the feedback signal will be either shortened or lengthened, respectively. If the number of phases are relatively large and the VCO frequency is relatively high, then the size of each step will be small. For example, if the VCO is operating at 1.544 MHz and has 12 phases, then the time between each phase is 53.97 ns. Each adjustment to the period of the feedback signal would therefore be 53.97 ns. This is a much smaller adjustment than the 647.67 ns adjustment which is the smallest adjustment possible when each adjustment step is defined by the period of the 1.544 MHz clock. Since the adjustments are relatively small, the rate at which they occur must be more frequent. The frequency of the jitter introduced into the feedback signal will be relatively high and its amplitude will be relatively small. Both of these conditions simplify the design of the loop filter needed for jitter suppression. A preferred embodiment of the present invention operates the VCO at a multiple of the desired output, thus further reducing the time between each phase. Subsequently, the output of the VCO must be divided to derive the desired output.

DESCRIPTION OF THE PREFERRED EMBODIMENT

Figure 1:
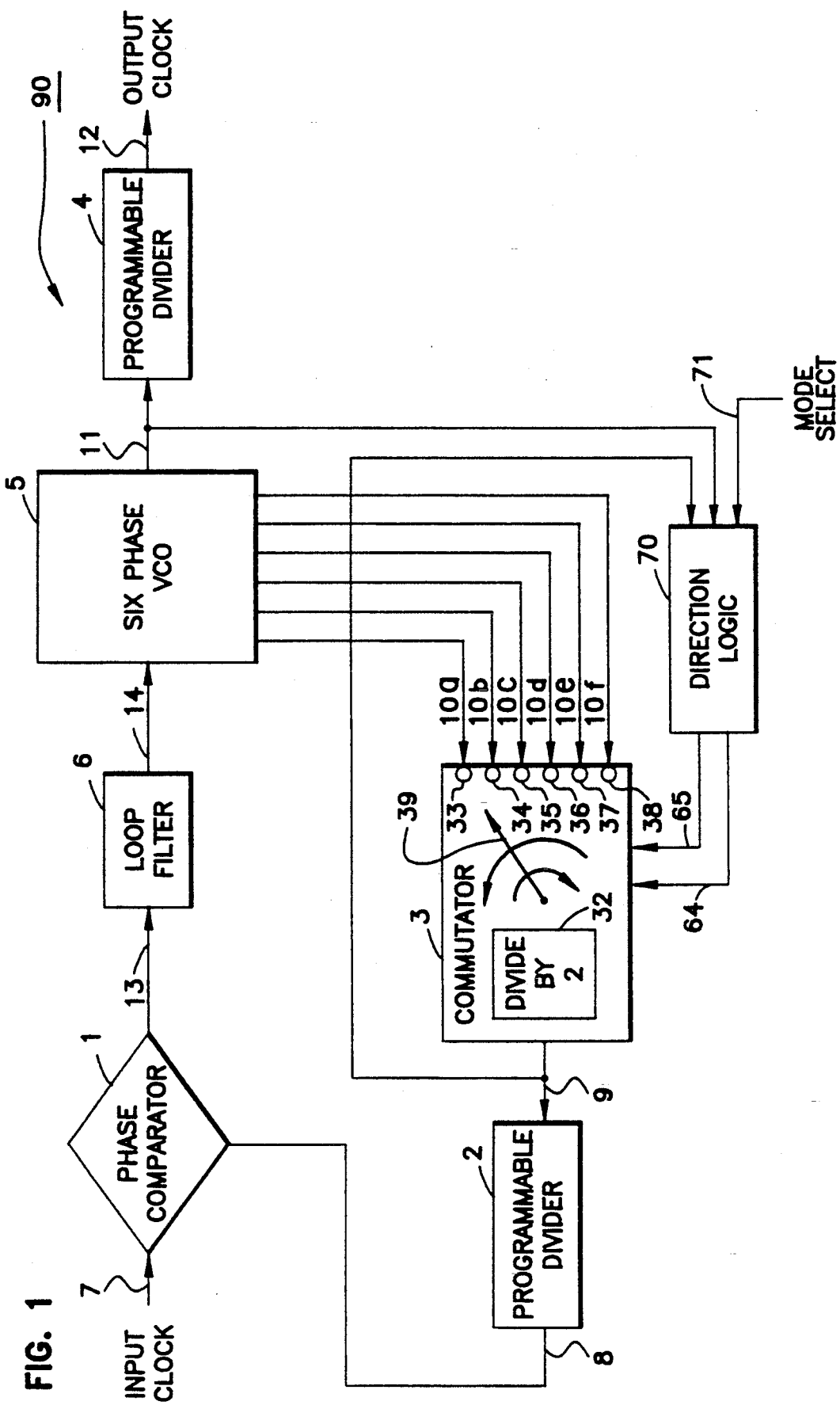
FIG. 1 is a system block diagram of the present invention.

A block diagram of a preferred embodiment is shown in FIG. 1. This configuration is basically that of a frequency multiplier except that: 1) the VCO 5 has multiple output phases, 2) a commutator 3 is placed between the VCO 5 and the programmable divider 2 in the feedback loop and 3) a programmable divider 4 is added to derive the output clock 12 from the output 11 of the VCO. Since the functioning of a phase comparator, loop filter and programmable dividers are well known, only the multi-phase VCO, controlled commutator and the general operating modes will be explained in detail.

Multi-Phase VCO

Figure 2:
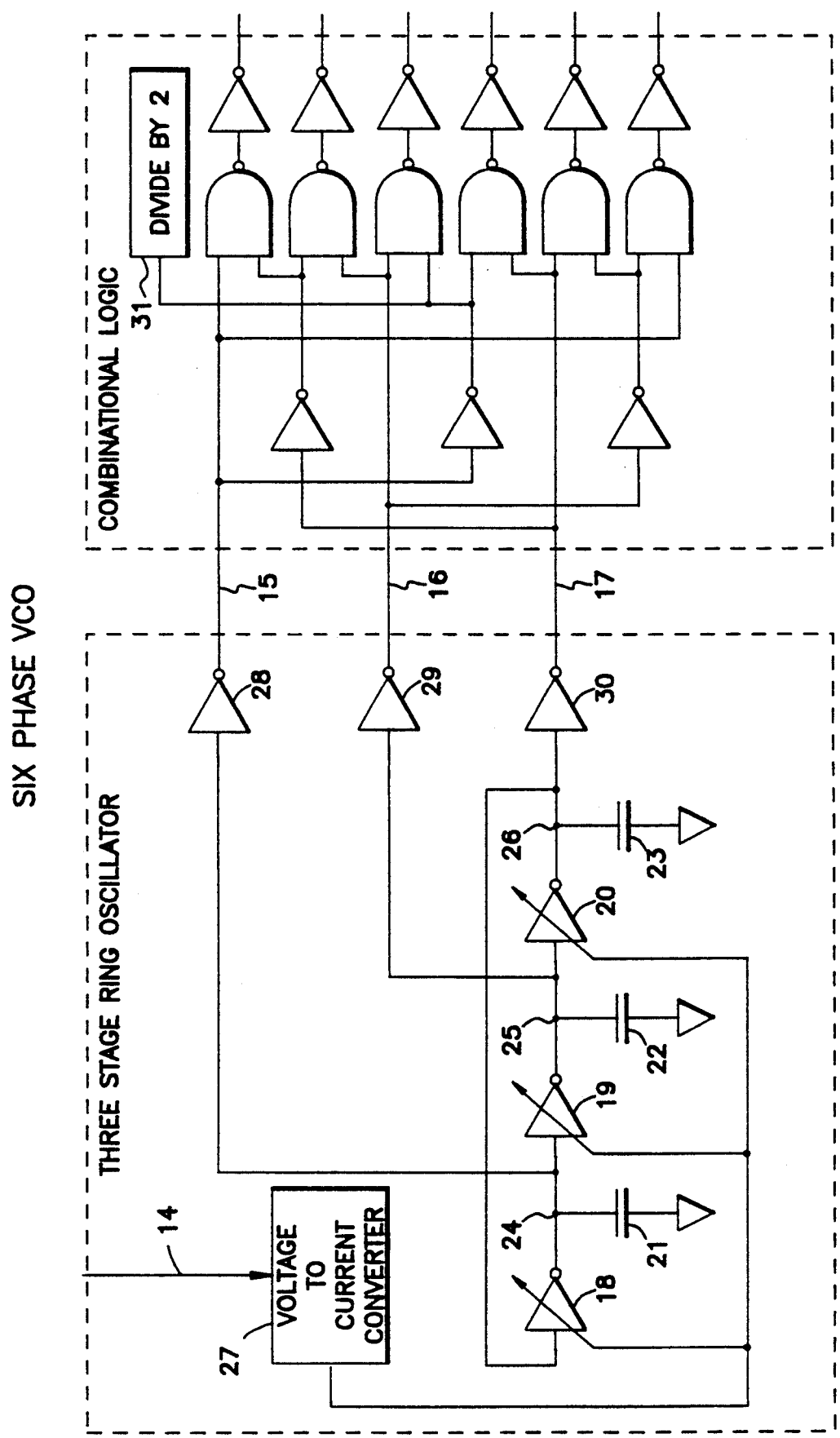
FIG. 2 is a circuit diagram of Multi-phase VCO as depicted in FIG. 1.
Figure 3:
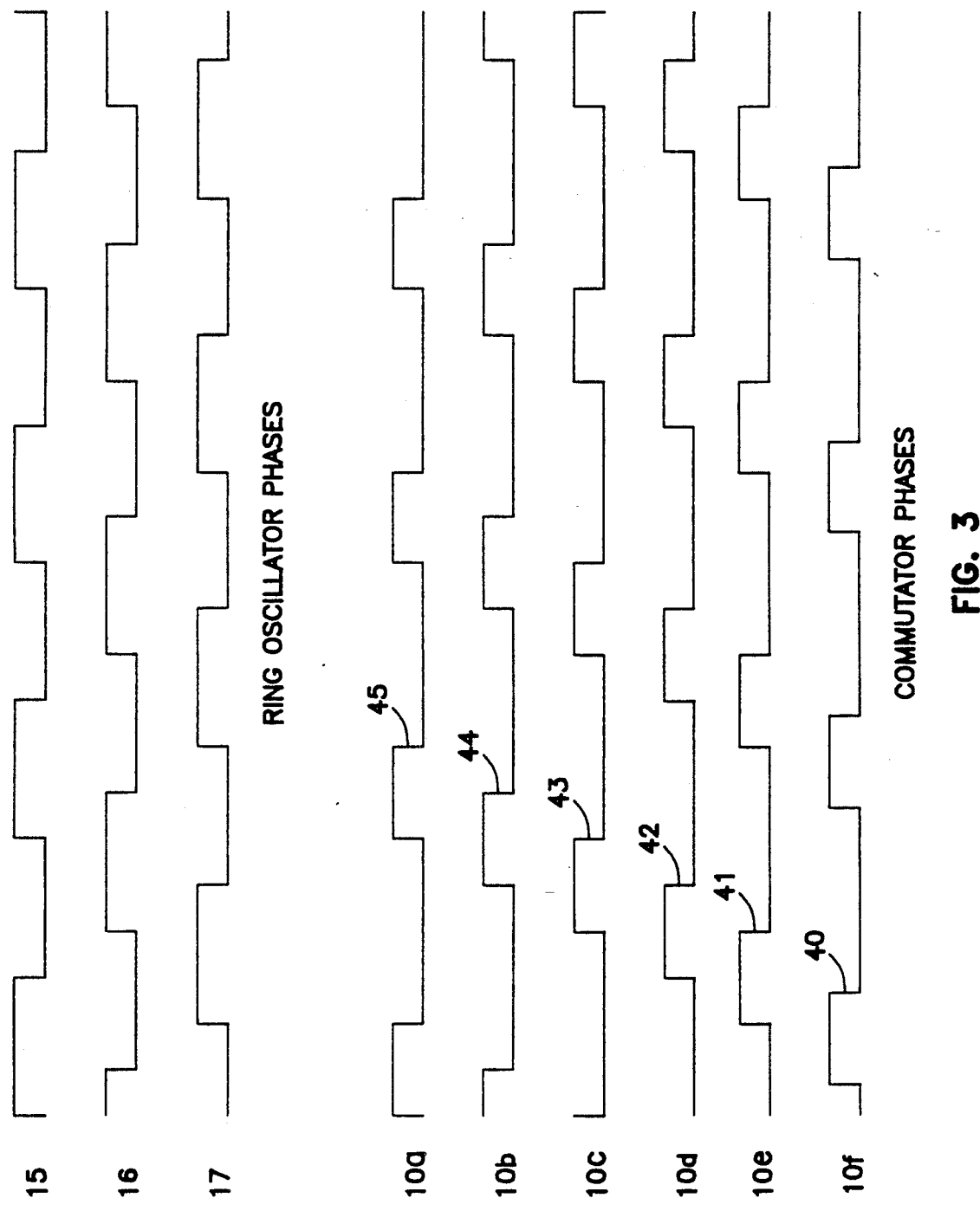
FIG. 3 depicts the phase relationships in the ring oscillator and commutator circuits as shown in FIG. 1.

As seen in FIG. 2, the voltage controlled oscillator 5 used in a preferred embodiment is implemented as a three stage ring oscillator. Each of the three stages are composed of an inverter 18, 19, 20 and a capacitor 21, 22, 23. The inverters are connected in a ring and a capacitor is connected to each of the nodes 24, 25, 26 between the inverters. The rate at which an inverter can charge or discharge a capacitor is controlled by a common current reference. The frequency of oscillation can be controlled by varying this reference current. A voltage to current converter 27, provides the means by which the error voltage 14, generated by the phase comparator 1 and the loop filter 6, controls the reference current. The output of each stage in the ring is buffered with an inverting buffer 28, 29, 30. The oscillator is designed such that the output 15, 16, 17 of each stage will have a 50% duty cycle and each oscillator phase will be equally spaced in time, as shown in FIG. 3. These phases, in turn, drive simple combinational logic that produces the six phases 10a, 10b, 10c, 10d, 10e, 10f used by the controlled commutator 3. The Multi-Phase VCO 5 also includes a divide by two circuit 31 that produces a 50% duty cycle output clock 11 which is used to generate the output clock 12.

Controlled Commutator

Figure 4:
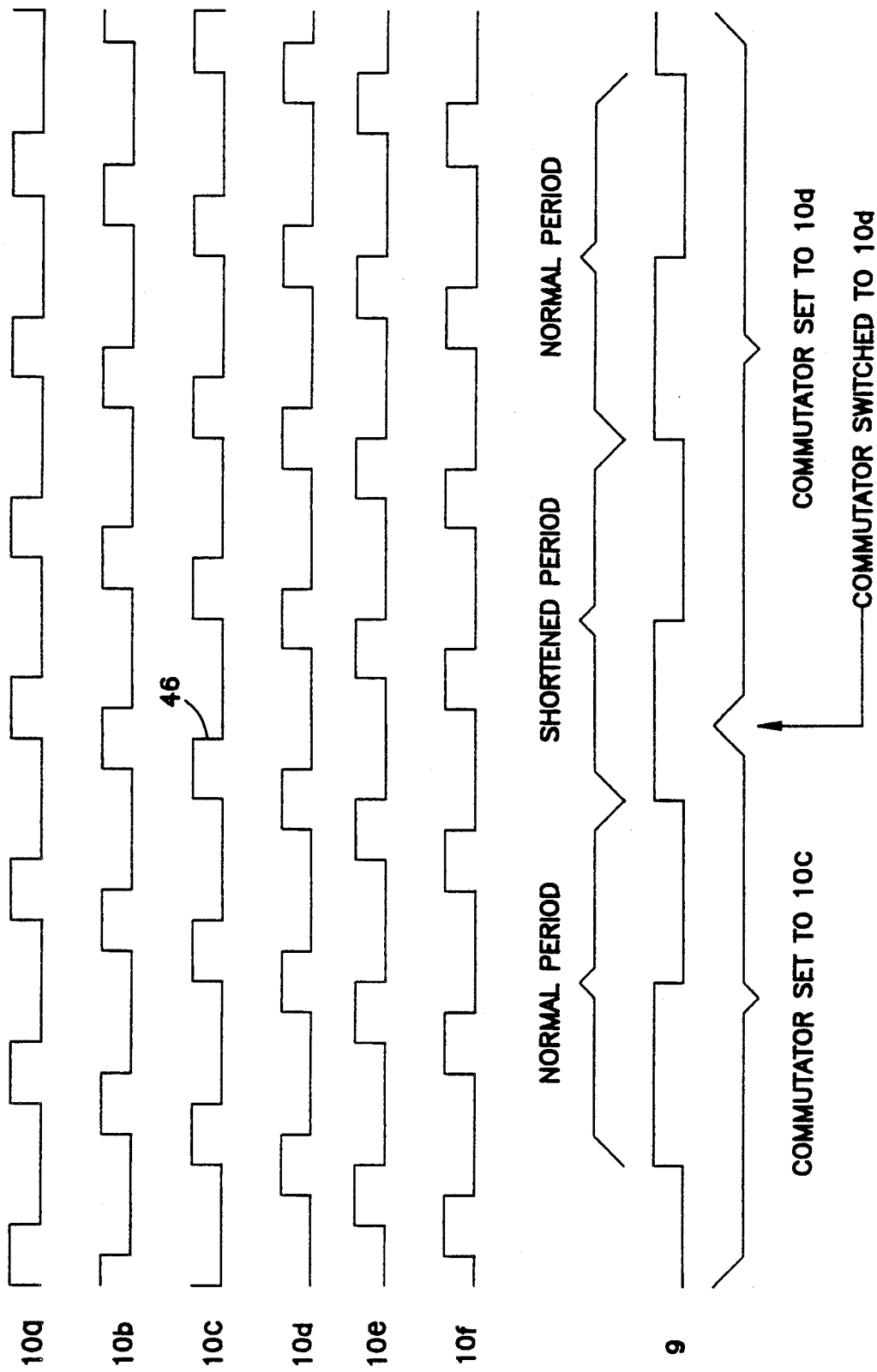
FIG. 4 depicts the phase relationships in the commutator during an increment operation.
Figure 5:
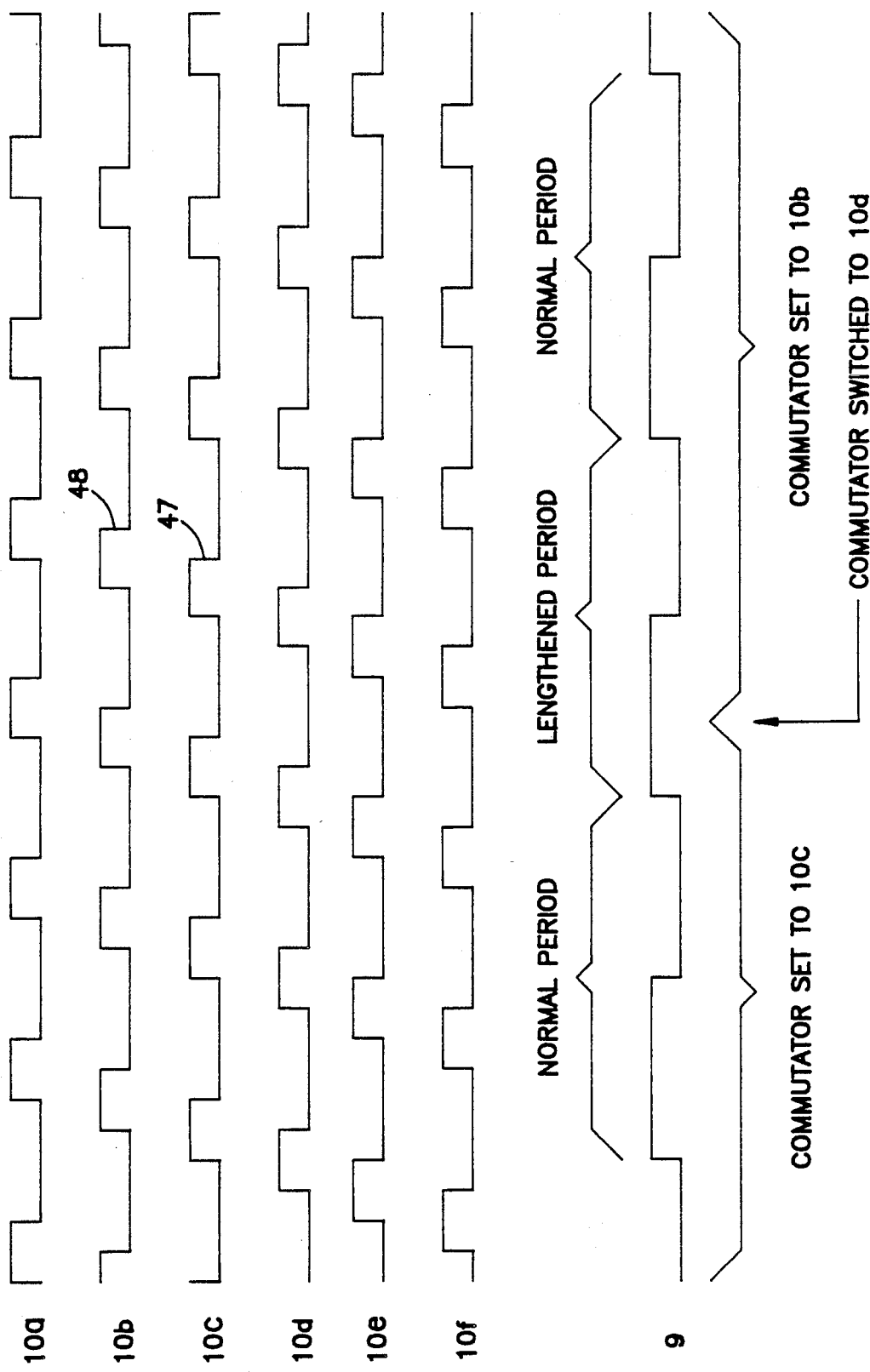
FIG. 5 depicts the phase relationships in the commutator during a decrement operation.

Each of the six phases 10a, 10b, 10c, 10d, 10e, 10f has a duty cycle of 33% and the falling edges 40, 41, 42, 43, 44, 45 are equally spaced in time, as shown in FIG. 3. By switching from one phase to an adjacent phase, small periods of time can be added or subtracted from the period of the output signal. To fully appreciate this, assume that the commutator 3 is set to select signal 10c. In this position signal 10c is passed to divide by two circuit 32 to produce signal 9 which has a 50%, duty cycle at half the frequency of signal 10c. If the commutator is incremented from signal 10c to 10d on the falling edge 46 of signal 10c then the period of signal 9 will be shortened by one sixth of the period of the VCO signal 10c, as shown in FIG. 4. Likewise, if the commutator 3 is set to select signal 10c and is decremented to 10b after the falling edges 47, 48 of both 10c and 10b then the period of signal 9 will be lengthened by one sixth of the period of 10c, as shown in FIG. 5. In the case of either adjustment the duty cycle of the commutator output 9 varies from 50% by less than 10%.

Since the period of signal 9 can be modified in this manner it is possible to change the time average frequency of signal 9 by periodically adding or subtracting a small time increment to or from signal 9. The regularity with which this is done determines the amount of frequency shift induced into signal 9. As will be described, the commutator 3 is controlled by a simple modulo six state counter 55 and a 1 of 6 decoder 49 which decodes the three output bits 80, 81, 82 (one state) of the counter 55 into six enable lines (59a-f) only one of which is active at a time. The six lines are energized sequentially; the sequence depending upon whether the counter 55 is counting up or down. The up/down count control signals are generated by direction logic 70 which considers three signals, namely the VCO output 11, whether the mode select 71 is from 2.048 to 1.544 MHz or vice versa, and the commutator output 9. As will be explained later in the general modes of operation, when the reference input is 2.048 MHz and the desired output is 1.544 MHz, the required frequency of the signal 9 necessary to satisfy the phase comparator in steady state is 6.144 MHz and the required VCO output signal 11 before scaling necessary to generate the 1.544 MHz signal is 6.178 MHz. When the conversion is from 1.544 MHz to 2.048 MHz, the frequency requirements of the signals are transposed, namely, the signal 9 needs to be 6.176 MHz and the VCO output signal 11 needs to be 6.144 MHz. In order to reconcile these requirements without a non-integer division or multiplication, the commutator 3 advances or retards the feedback input 8 to the phase comparator 1 so as to satisfy the feedback signal requirement while the VCO 5 maintains the proper output frequency necessary for the output clock 12. The direction logic 70 determines whether to control the modulo six state counter 55 to count up or down thus advancing or retarding, sequencing the signals from 10a-f or 10f-a respectively.

The PLL 90 commands the commutator 3 to retard the feedback signal so as to cause the VCO 5 to increase its output signal frequency when the PLL 90 is adapting from 2.048 to a 1.544 MHz clock Likewise, the commutator is commanded to advance the feedback signal so as to cause the VCO 5 to decrease its output signal frequency when the PLL 90 adapting from a 1.544 to a 2.048 MHz clock. The advancing or retarding only occurs once every sixteen cycles so as to minimize PLL jitter.

Figure 6:
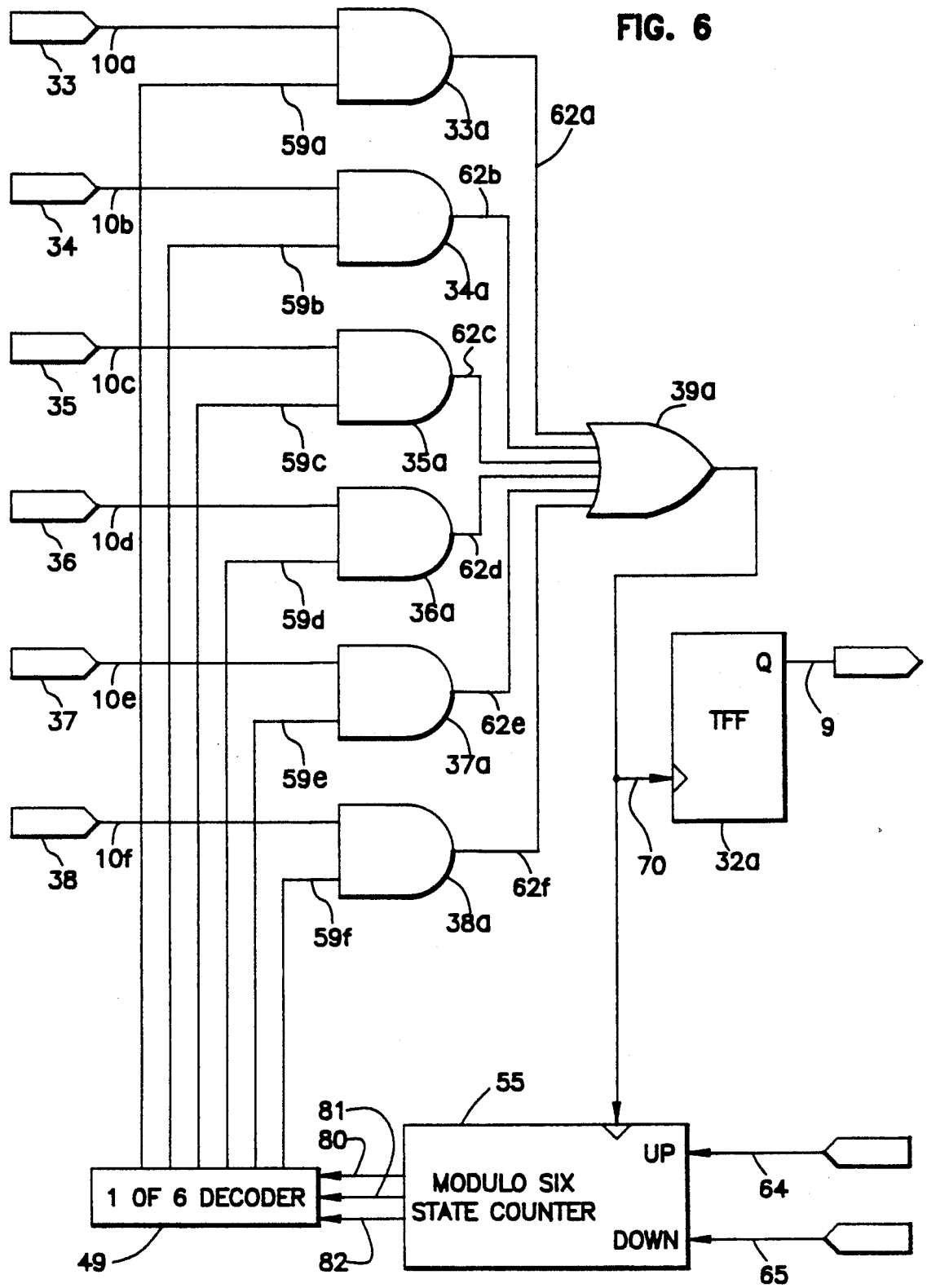
FIG. 6 is a circuit diagram of the commutator as depicted in FIG. 1.

The actual implementation of the Controlled Commutator 3 is best understood by referring to FIG. 6. Each of the "poles" 33, 34, 35, 36, 37 and 38 of the commutator are electrically connected to one terminal of AND gates 33a, 34a, 35a, 36a, 37a and 38a shown in the block diagram. The "wiper" 39 is analogous to the output 70 of OR gate 39a. The divide by two function 32 is performed by the TFF block 32a. The selection means (normally achieved by the physical movement of the wiper 39) is accomplished by the 1 of 6 decoder 49 and the state counter 55. Together these two blocks generate the enable signals which drive the second input of AND gates 33a, 34a, 35a, 36a, 37a and 38a.

For example a high on signal 59c would permit signal 10c to pass through to OR gate 39a along signal path 62c. In this case the output 70 of OR gate 39a is virtually identical to signal 10c. The commutator output 9 is then generated by dividing signal 70 by 2 in TFF 32a. If a "speed up" request is received from the direction logic 70 on signal path 64, the state counter 55 is incremented causing enable 59c to return low and enable signal 59d to go high. This advances the phase of the commutator output 9 from 10c to 10d. The "speed up" operation is shown in FIG. 4. On the other hand, if a "slow down" request is received from the direction logic 70 on signal path 65, the state counter 55 is decremented causing enable 59c to return low and enable signal 59b to go high. This allows the phase of the commutator output 9 to fall back from that of 10c to match that of 10b. The "slow down" operation is shown in FIG. 5. As will be readily appreciated by those skilled in the art, any conventional implementation of a controlled commutator may be utilized, such as those already referenced in U.S. Pat. Nos. 4,584,695 and 4,733,197.

General modes of Operation

A preferred embodiment has two modes of operation. The first mode accepts an input clock at 2.048 MHz and produces an output clock at 1.544 MHz. The second mode of operation accepts an input clock at 1.544 MHz and produces an output clock at 2.048 MHz. Both modes will be discussed in detail and will refer to the system block diagram in FIG. 1. Both modes operate the VCO 5 at a frequency that is less than eight times the reference input. This greatly eases the design requirements for the loop filter as well as the overall design of the phase locked loop.

One novel aspect of the present invention is that through the combination of the multi-phase VCO 5 and the controlled commutator 3, relatively tiny adjustments can be made to the feedback signal 8. By keeping the feedback signal 8 frequency adjustments small the loop will experience only minor disruptions. Further by adjusting the period of the feedback signal 8 in small increments and by making these adjustments at a high rate, the frequency content of the disruption is kept high. These high frequency components can subsequently be removed or greatly reduced by the loop filter 6. The result is a low jitter output with an accuracy derived from the input reference 7.

2.048 MHz to 1.544 MHz Conversion

In this mode of operation a 2.048 MHz clock signal is applied to input lead 7. The programmable divider 2 in the feedback path is set to divide by three, the programmable divider 4 in the output path is set to divide by four and the desired output is 1.544 MHz. Given this set of conditions the operating conditions for each block in FIG. 1 can be determined. If the output of the programmable divider 4 in the output path is to be held at 1.544 MHz and this divider is set to divide by four then VCO output 11 must be held at 6.176 MHz. Therefore the VCO 5 must be operating at 12.352 MHz. The period of each of the six VCO phases (10a-10f) would then be 80.959 ns and the time between adjacent phases is 13.493 ns. If the commutator 3 were not switched and selected only one VCO phase then the frequency of signal 9 would also be 6.176 MHz.

In order for the loop to lock, the phase comparator feedback input 8 must have the same frequency and phase as the signal applied to the input lead 7. As previously stated a 2.048 MHz clock is applied to lead 7 so the frequency of signal 8 must also be 2.048 MHz. Since the programmable divider 2 in the feedback path is set to divide by three the output of the commutator, signal 9, must be maintained at 6.144 MHz. Therefore, it is desirable to periodically add small time increments to the period of signal 9 such that the time average frequency of this signal will be translated from 6.176 MHz to 6.144 MHz.

To understand this translation, one needs to look at the relationship between a 6.176 MHz clock and the desired 6.144 MHz clock. If one starts at a point in time when the rising edges of both clocks exactly align, one observes that the edges diverge until they are 180 degrees out of phase and then converge again. The edges will realign 31.25 usec later. During this time the 6.144 MHz clock will have counted 192 cycles and the 6.176 MHz clock will have counted 193 cycles. Since the goal is to translate the 6.176 MHz clock to a 6.144 MHz clock, there is a need to remove one cycle of the 6.176 MHz clock during this 31.25μsec period. One cycle of the 6.176 MHz clock has a period of 161.92 ns which is 12 times the time interval between VCO phases. Therefore, if the commutator 3 is decremented twelve times during the 31.25 usec interval then the time average frequency of commutator output signal 9 will be 6.144 MHz. In order to minimize jitter these decrements should be equally spaced in time. Since the commutator output 9 is required to make 192 cycles during the 31.25 usec interval, the twelve decrements may be equally spaced by initiating one decrement for every 16 cycles of the commutator output 9. In the preferred embodiment, this control function is performed by the direction logic 70 which only issues a "slow down" once every 16 cycles of the commutator output 9.

1.544 MHz to 2.048 MHz Conversion

In this mode of operation a 1.544 MHz clock is applied to input lead 7. The programmable divider 2 in the feedback path is set to divide by four, the programmable divider 4 in the output path is set to divide by three, and the desired output frequency is 2.048 MHz. Again the operating conditions for each circuit block in FIG. 1 can be determined. Since the output of the programmable divider 4 in the output path 11 is to be held at 2.048 MHz and the divider 4 is set to divide by three, the VCO output 11 must be held at 6.144 MHz. The VCO 5 must operate at 12.288 MHz. The period of each of the six VCO phases (10a-10f) is 81.380 nsec and the time between adjacent phases is 13.563 ns. If the commutator 3 were to remain on one particular VCO phase then the frequency of signal 9 would also be 6.144 MHz. The programmable divider 2 in the feedback path is set to divide by four such that the commutator output signal 9 must be maintained at 6.176 MHz in order for the loop to lock. It is therefore desirable to periodically subtract small time increments from the period of signal 9 such that the time average frequency will be 6.176 MHz.

As was presented for the case of conversion from 2.048 MHz to 1.544 MHz, the two frequencies of interest are 6.144 MHz and 6.176 MHz. In this case, however, one cycle must be added to the 6.144 MHz signal during a 31.25 usec interval in order to achieve the desired 6.176 MHz signal. The total amount of time that must be subtracted from the 6.144 MHz clock in order to add one cycle is 162.76 ns. Again this is twelve times the time interval between VCO phases. Therefore, if the commutator 3 is incremented twelve times during the 31.25 usec interval then the time average frequency of commutator output signal 9 will be 6.176 MHz. This can be accomplished by initiating one increment for every sixteen cycles of the VCO output 11. In this mode the increment function is performed by the direction logic 70 which issues a speed up command once every sixteen cycles of the VCO output 11.

I claim:

1. A frequency multiplier, comprising:

a) an input port, the input port being adapted to receive an input signal having a first frequency;
    b) a voltage controlled oscillator, the voltage controlled oscillator generating a plurality of oscillator signals, each oscillator signal having a substantially identical second frequency, the second frequency being a nonintegral multiple of the first frequency, each oscillator signal having a different phase relationship to every other oscillator signal;
    c) frequency translation means, the frequency translation means being cooperatively coupled to the plurality of oscillator signals so as to permit shifting the oscillator signal from the second frequency to a third frequency, the third frequency being an integral multiple of the first frequency and the first frequency being related to the second frequency by a ratio, the frequency multiplier further comprising commutator means, the commutator means permitting the ratio between the first frequency and the second frequency to be altered;
    d) divider means, the divider means being cooperatively coupled to the frequency translation means, the divider means dividing the third frequency by an integer so as to produce a divider output signal substantially equal to the first frequency; and
    e) a phase comparator, the phase comparator having a first input cooperatively coupled to the input port, the phase comparator having a second input cooperatively coupled to the divider output signal, the phase comparator generating an error voltage proportional to the phase difference between the input signal and the divider output signal, the error voltage being cooperatively coupled to the voltage controlled oscillator, thereby causing the voltage controlled oscillator to generate an oscillator signal which, after processing by the frequency translation means and the divider means, is of a frequency substantially equal to the first frequency.

2. The frequency multiplier of claim 1, wherein the phase difference between oscillator signals is equally spaced such that every oscillator signal leads an adjacent oscillator signal by an equal phase angle.

3. The frequency multiplier of claim 2, wherein the frequency translation means comprises:

1) a plurality of phase input ports, each phase input port corresponding to a different oscillator signal, each phase input port being cooperatively coupled to the voltage controlled oscillator so as to receive an oscillator signal having a phase angle that is different from the phase angle of every other oscillator signal; and
    2) a selector, the selector being capable of selecting any single phase input port oscillator signal, the selector thereby cooperatively connecting a particular oscillator signal to the divider means.

4. The frequency multiplier of claim 3, wherein the selector is only capable of switching to a phase input port that is adjacent to a presently selected phase input port, thereby permitting the oscillator signal processed by the divider means to shift by an increment equal to the phase difference between adjacent oscillator signals.

5. The frequency multiplier of claim 4, wherein the divider means is adjustable, the divider means being cooperatively connected to the commutator means, thereby varying the integer by which the oscillator signal exiting the frequency translation means is divided so as to ultimately alter the ratio between the first frequency and the second frequency.

6. The frequency multiplier of claim 5, further comprising a loop filter, the loop filter being cooperatively connected to the phase comparator so as to intercept and filter the error voltage prior to application of the error voltage to the voltage controlled oscillator.

7. A phase locked loop, comprising:
  a) an input signal, the input signal having an input signal frequency;
  b) an output signal, the output signal having an output signal frequency that is a nonintegral multiple of the input signal frequency;
  c) a multiphased voltage controlled oscillator, the multiphased voltage controlled oscillator operating on an oscillator frequency, the oscillator frequency being an integral multiple of the output frequency;
  d) a commutator, the commutator being capable of selecting an oscillator output signal having a particular phase angle, the commutator being electrically coupled to the multiphased voltage controlled oscillator;
  e) a first programmable divider, the first programmable divider being electrically coupled to the commutator, the first programmable divider dividing the oscillator output signal selected by the commutator by an integer;
  f) a phase comparator, the phase comparator comprising the input signal with a signal exiting the first programmable divider, the phase comparator generating an error signal proportional to any phase difference between the compared signals, the error signal being electrically coupled to the multiphased voltage controlled oscillator, the error signal tending to cause the multiphased voltage controlled oscillator to operate on a desired oscillator frequency; and
  g) a second programmable divider, the second programmable divider being electrically coupled to the oscillator output signal, the second programmable divider dividing the oscillator output signal by an integer so as to produce the output signal.

8. The phase locked loop of claim 7, wherein the multiphased voltage controlled oscillator further comprises:
  a plurality of oscillator output signals, the plurality being of quantity "N", each oscillator output signal being of substantially identical frequency, each oscillator output signal being of a different phase; and
  a plurality of oscillator output signal ports, each oscillator output signal port being electrically coupled to the commutator, the commutator being capable of selecting any one of the oscillator output signal ports so as to electrically couple a single oscillator output signal to the first programmable divider.

9. The phase locked loop of claim 8, wherein the phase angle of each adjacent oscillator output signal differs from the phase angle of any other adjacent oscillator output signal by 360°/N.

10. The phase locked loop of claim 9, wherein the multiphased voltage controlled oscillator further comprises:
  a three stage ring oscillator, each stage including an inverter and a capacitor, the inverters being electrically connected so as to form a ring, the oscillator frequency being controlled by an electrical current; and
  a voltage to current converter, the voltage to current converter being electrically coupled to the error signal generated by the phase comparator, the voltage to current converter thereby generating an electrical current, the electrical current being coupled to the three stage ring oscillator so as to control the oscillator frequency.

11. The phase locked loop of claim 10, wherein the multiphased voltage controlled oscillator further comprises:
  three inverting buffers, each inverting buffer being connected to a corresponding stage of the three stage ring oscillator, thereby buffering each stage output; and
  logic means, the logic means being electrically coupled to the oscillator output signal ports, the logic means creating six oscillator output signals having equally offset phase angles.

12. The phase locked loop of claim 11, wherein each stage of the three stage ring oscillator operates at a fifty percent duty cycle.

13. The phase locked loop of claim 11, wherein the three stage ring oscillator operates at a frequency twice as large as the oscillator output signal, the multiphased voltage controlled oscillator further comprising a divider circuit, the divider circuit dividing any three stage firing oscillator output signal by two, thereby creating the multiphased oscillator output signal operating at the output frequency.

14. A frequency adjustment apparatus, comprising:
  a) a multiphased voltage controlled oscillator, comprising:
    i) a plurality "N" of multiphase signal output ports, each multiphase signal output port providing a single phase signal, each single phase signal having an instantaneous phase angle that is separated from adjacent single phase signals by an integral multiple of 360°/N;
    ii) an oscillator output port, the oscillator output port providing an output signal having a frequency substantially one half of any single phase signal frequency;
  b) a commutator, comprising:
    i) a plurality of commutator input ports, each commutator input port corresponding to a multiphase signal output port and being electrically coupled therewith;
    ii) selector means, the selector means permitting the selection within the commutator of another single phase signal having a phase angle which is separated by substantially 360°/N from a presently selected single phase signal;
    iii) a commutator output port, the commutator output port making the presently selected single phase signal available as a commutator output signal for further processing by devices external to the commutator; and
  c) wherein the selector means selects an adjacent single phase signal "A" number of times per unit of time "B", according to the relationship:

$$F_o = F_i((B + (A \cdot s))/B)$$

where:
B = time period during which selection is accomplished,
$F_i$ = frequency of the single phase signal,
$F_o$ = time averaged frequency of the commutator output port signal, and s = time between phase edges of adjacent single phase signals.

15. The frequency adjustment apparatus of claim 14, wherein the selector means always selects an adjacent single phase signal having a waveform leading edge which trials the presently selected single phase signal when the frequency of the multiphased voltage controlled oscillator is greater than the time averaged frequency of the presently selected single phase signal.

16. The frequency adjustment apparatus of claim 15, wherein the selector means always selects an adjacent single phase signal having a waveform leading edge which leads the presently selected single phase output signal when the frequency of the multiphased voltage controlled oscillator is less than the time averaged frequency of the presently selected single phase signal.

* * * * *

UNITED STATES PATENT AND TRADEMARK OFFICE
CERTIFICATE OF CORRECTION

PATENT NO.   : 5,059,924
DATED        : October 22, 1991
INVENTOR(S)  : William S. JenningsCheck It is certified that error appears in the above-identified patent and that said Letters Patent is hereby corrected as shown below:

Column 4, line 53, delete "," after the numeral "50%".
Column 5, line 41, insert --is-- after the numeral "90".
Column 9, claim 7, lines 26 and 27, "comprising" should read --comparing--.
Column 10, claim 13, line 25, "firing" should read --ring--.

Signed and Sealed this

Eighteenth Day of May, 1993

Attest:

MICHAEL K. KIRK

*Attesting Officer*    *Acting Commissioner of Patents and Trademarks*